United States Patent
Yang et al.

(10) Patent No.: US 9,236,847 B2
(45) Date of Patent: Jan. 12, 2016

(54) COMMON MODE FILTER

(71) Applicant: Samsung Electro-Mechanics Co., Ltd., Suwon (KR)

(72) Inventors: Ju-Hwan Yang, Suwon (KR);
Sang-Moon Lee, Suwon (KR);
Jeong-Min Cho, Suwon (KR);
Young-Do Kweon, Suwon (KR);
Won-Chul Sim, Suwon (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/090,806

(22) Filed: Nov. 26, 2013

(65) Prior Publication Data

US 2015/0102884 A1    Apr. 16, 2015

(30) Foreign Application Priority Data

Oct. 15, 2013    (KR) .................... 10-2013-0122790

(51) Int. Cl.

| | | |
|---|---|---|
| H01F 5/00 | (2006.01) | |
| H01F 27/28 | (2006.01) | |
| H01F 27/24 | (2006.01) | |
| H03H 7/42 | (2006.01) | |
| H01F 17/00 | (2006.01) | |
| H03H 1/00 | (2006.01) | |

(52) U.S. Cl.
CPC ............ *H03H 7/427* (2013.01); *H01F 17/0006* (2013.01); *H01F 2017/0066* (2013.01); *H03H 2001/0092* (2013.01)

(58) Field of Classification Search
CPC . H01F 27/29; H01F 27/2804; H01F 17/0006; H01F 17/0013
USPC ..................... 336/200, 232–234, 83
See application file for complete search history.

(56) References Cited

U.S. PATENT DOCUMENTS

| | | | | |
|---|---|---|---|---|
| 5,802,688 | A * | 9/1998 | Tanaka ..................... | 29/25.42 |
| 7,091,816 | B1 * | 8/2006 | Ito et al. .................... | 336/200 |
| 2003/0151849 | A1 * | 8/2003 | Sasaki et al. .............. | 360/123 |
| 2005/0030144 | A1 * | 2/2005 | Yoshida et al. ............ | 336/200 |
| 2005/0195062 | A1 * | 9/2005 | Yoshida et al. ............ | 336/200 |
| 2006/0068330 | A1 * | 3/2006 | Kamijima .................. | 430/311 |
| 2007/0285188 | A1 * | 12/2007 | Song et al. ................. | 333/12 |
| 2009/0045905 | A1 * | 2/2009 | Nakagawa et al. ........ | 336/232 |
| 2010/0157565 | A1 * | 6/2010 | Yoshida et al. ............ | 361/811 |
| 2011/0025443 | A1 * | 2/2011 | Hopper et al. ............. | 336/200 |
| 2012/0133472 | A1 * | 5/2012 | Nishikawa et al. ....... | 336/200 |

\* cited by examiner

*Primary Examiner* — Mangtin Lian
(74) *Attorney, Agent, or Firm* — McDermott Will & Emery LLP

(57) ABSTRACT

A common mode filter is disclosed. The common mode filter in accordance with an embodiment of the present invention includes: a magnetic substrate; a dielectric layer laminated on the magnetic substrate; an external electrode formed on the dielectric layer in such a way that one surface thereof is exposed to an outside; a conductive pattern formed on a surface of the dielectric layer so as to be located on a same plane as the external electrode and having one end thereof connected with the external electrode; an insulator film formed on a surface of the conductive pattern; and a magnetic layer formed on the insulator film so as to cover an upper surface and a lateral surface of the conductive pattern.

5 Claims, 2 Drawing Sheets

COMMON MODE FILTER

CROSS-REFERENCE TO RELATED APPLICATIONS

This application claims the benefit of Korean Patent Application No. 10-2013-0122790, filed with the Korean Intellectual Property Office on Oct. 15, 2013, the disclosure of which is incorporated herein by reference in its entirety.

BACKGROUND

1. Technical Field

The present invention relates to a common mode filter.

2. Background Art

High-speed digital interfaces, such as USB, require a part that address noise. One of such parts that removes common mode noise selectively is a common mode filter.

Common mode noise can occur when impedance fails to be parallel in the wiring system. The common mode noise can occur more often for higher frequency. Since the common mode noise can be also transferred to, for example, the surface of the earth and bounced back with a big loop, the common mode noise causes various kinds of noise troubles in far-away electronic devices.

The common mode filter can allow a differential mode signal to bypass while selectively removing the common mode noise. In the common mode filter, magnetic flux is canceled out by the differential mode signal, causing no inductance to occur and allowing the differential mode signal to bypass. On the other hand, magnetic flux is augmented by the common mode noise, increasing the inductance and allowing the noise to be removed.

The related art of the present invention is disclosed in Korea Patent Publication No. 2011-0129844 (COMMON MODE NOISE FILTER; laid open on Dec. 6, 2011).

SUMMARY

The present invention provides a common mode filter, in which a conductive pattern thereof is formed in a single layer and in which a magnetic layer thereof covers an upper surface and a lateral surface of the conductive pattern.

The common mode filter in accordance with an embodiment of the present invention includes: a magnetic substrate; a dielectric layer laminated on the magnetic substrate; an external electrode formed on the dielectric layer in such a way that one surface thereof is exposed to an outside; a conductive pattern formed on a surface of the dielectric layer so as to be located on a same plane as the external electrode and having one end thereof connected with the external electrode; an insulator film formed on a surface of the conductive pattern; and a magnetic layer formed on the insulator film so as to cover an upper surface and a lateral surface of the conductive pattern.

The conductive pattern can include a plurality of straight-line parts and a plurality of connection parts configured to connect the plurality of straight-line parts with each other.

The connection part can be in the shape of a curve.

The conductive pattern can be in a zigzag shape.

The insulator film can include an oxide film.

The insulator film can be contiguously formed along the surface of the conductive pattern and on the dielectric layer.

The magnetic layer can include magnetic powder and resin material.

The magnetic powder can cover the lateral surface of the conductive pattern.

The magnetic powder can cover the upper surface of the conductive pattern.

DETAILED DESCRIPTION

Figure 1:
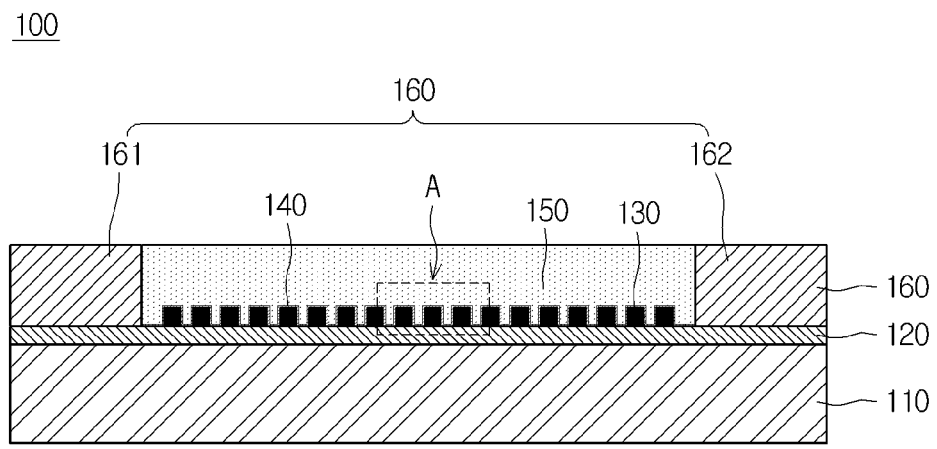
FIG. 1 shows a cross-sectional view of a common mode filter in accordance with an embodiment of the present invention.

Hereinafter, a certain embodiment of a common mode filter in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 2:
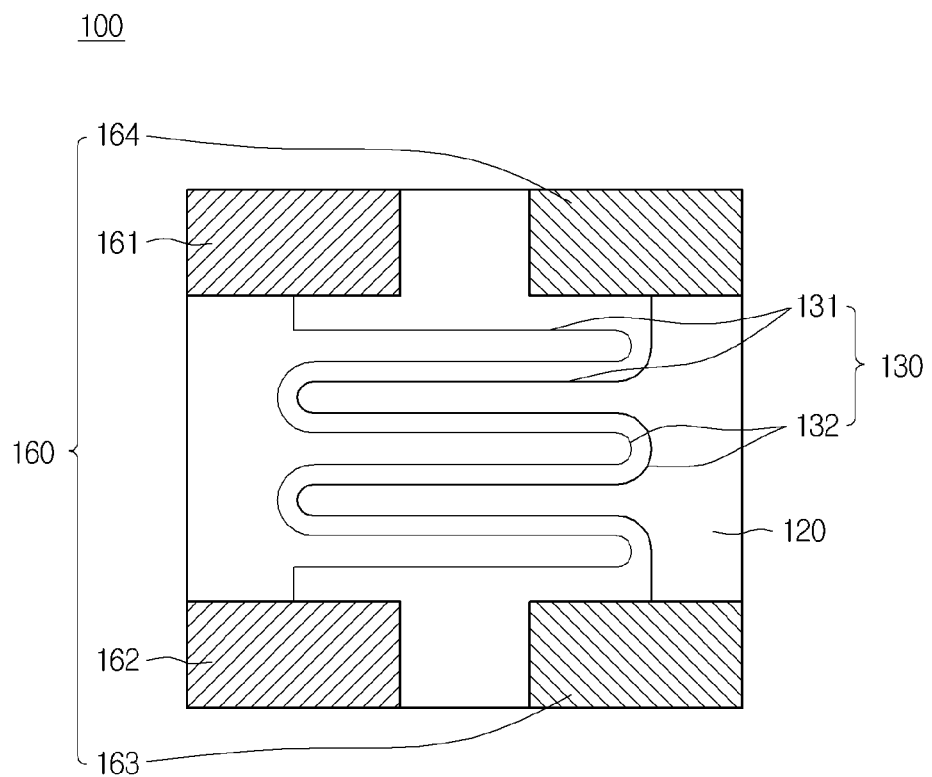
FIG. 2 shows a conductive pattern of the common mode filter in accordance with an embodiment of the present invention.
Figure 3:
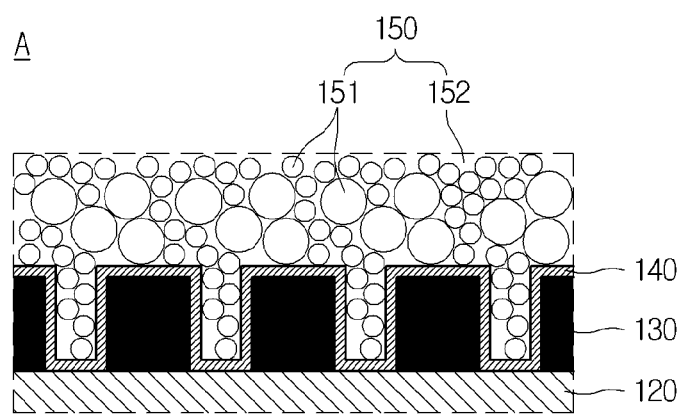
FIG. 3 shows a magnetic layer of the common mode filter in accordance with an embodiment of the present invention.

FIG. 1 shows a cross-sectional view of a common mode filter in accordance with an embodiment of the present invention, and FIG. 2 shows a conductive pattern of the common mode filter in accordance with an embodiment of the present invention, and FIG. 3 shows a magnetic layer of the common mode filter in accordance with an embodiment of the present invention.

Referring to FIG. 1, the common mode filter in accordance with an embodiment of the present invention can include magnetic substrate 110, dielectric layer 120, external electrode 160, conductive pattern 130, insulator film 140 and magnetic layer 150.

The magnetic substrate 110 is a board that is magnetic and is placed at a lowermost location of the common mode filter. The magnetic substrate 110 can be made of a material that includes ferrite.

The dielectric layer 120 is formed on the magnetic substrate 110. The dielectric layer 120 functions to insulate the conductive pattern 130 from the magnetic substrate 110. Preferably used as a material for the dielectric layer 120 can be polymer resin, which has a good electrical insulation property and is highly workable, for example, epoxy resin or polyimide resin.

The external electrode 160, through which signals are inputted and outputted, is formed on the dielectric layer 120. The external electrode 160 is formed in such a way that one face thereof is exposed to an outside. The external electrode 160 can include a pair of input electrodes and a pair of output electrodes.

As shown in FIG. 2, the external electrode 160 can include a first electrode 161, a second electrode 162, a third electrode 163 and a fourth electrode 164. Here, the first electrode 161 and the third electrode 163 can be input electrodes, and the second electrode 162 and the fourth electrode 164 can be output electrodes.

Referring to FIGS. 1 and 2, the conductive pattern 130 functions as an inductor, and an end part of the conductive pattern 130 is connected with the external electrode 160. A signal inputted through the input electrode of the external electrode 160 is transferred through the conductive pattern 130 and exits through the output electrode of the external electrode 160. A plurality of conductors that constitute the conductive pattern 130 are arranged to be adjacent to each other but not to be overlapped with each other.

The conductors of the conductive pattern 130 can be made of copper (Cu) or aluminum (Al), which is highly conductive and workable. Moreover, the conductive pattern 130 can be formed through photolithography and plating.

The conductive pattern 130 can be constituted with a pair of conductors. Magnetic coherence occurs in between the pair of conductors of the conductive pattern 130. In the case of common mode noise, the inductance becomes augmented as the magnetic flux occurred by the common mode noise is combined. As a result, the noise can be removed.

Each of the pair of conductors in the conductive pattern 130 can be connected to one input electrode and one output electrode, respectively. That is, one of the pair of conductors of the conductive pattern 130 is connected with the first electrode 161 and the second electrode 162, and the other of the pair of conductors of the conductive pattern 130 is connected with the third electrode 163 and the fourth electrode 164.

The conductive pattern 130 and the external electrode 160 are located on a same plane and are formed on a surface of the dielectric layer 120. In such a case, the conductive pattern 130 can be formed in a single-layer structure. In the case where the conductive pattern 130 is formed in a dual-layer structure, parasitic capacitance occurs in between the layers, and signals can be lost when high-frequency signals are transmitted.

As illustrated in FIG. 2, the conductive pattern 130 can include a plurality of straight-line parts 131 and a plurality of connection parts 132. The straight-line part 131 is a pattern that is realized in a straight-line form on the dielectric layer 120. The connection part 132 is a pattern that connects a plurality of straight-line parts 131 with each other. By constituting the conductive pattern 130 through combination of the straight-line parts 131 and the connection parts 132, the length of the pattern can be increased, and accordingly the inductance can be increased.

The connection part 132 can be in the shape of a curve. If the connection part 132 were bent at right angle, resistance could be concentrated at the bent portion.

Accordingly, signals can be uniformly transferred when the connection part 132 is curved.

The conductive pattern 130 can be in a zigzag shape. Moreover, since the zigzag shape of the conductive pattern 130 is advantageous for utilizing the space on the surface of the dielectric layer 120, the length of the conductive pattern 120 can be increased.

Referring to FIG. 3, the insulator film 140 is a film that covers the conductive pattern 130. The insulator film 140 insulates the conductive pattern 130 from the magnetic layer 150, which will be described later. The insulator film 140 can be formed along a surface of the conductive pattern 130. Moreover, as shown in FIG. 3, the insulator film 140 can be contiguously formed along the surface of the conductive pattern 130 and the surface of the dielectric layer 120.

The insulator film 140 can include an oxide film, which can be formed through deposition (e.g., chemical vapor deposition or physical vapor deposition). The oxide film formed through deposition can be sufficiently thin.

The magnetic layer 150 is a layer that is formed on the insulator film 140 and is magnetic. The magnetic layer 150 forms a closed-magnetic circuit together with the magnetic substrate 110. Magnetic coupling of the conductive pattern 130 can be enhanced by the strong magnetic flux formed by the magnetic layer 150 and the magnetic substrate 110.

The magnetic layer 150 can include magnetic powder 151 and resin material 152. The magnetic powder 151 allows the magnetic layer 150 to be magnetic, and the resin material 152 allows the magnetic layer 150 to have fluidity. In such a case, the magnetic powder 151 can include ferrite.

The magnetic layer 150 can be formed so as not to cover the external electrode 160. That is, the magnetic layer 150 can be formed to avoid the external electrode 160.

The magnetic layer 150 is formed on the insulator film 140 so as to cover every upper surface and lateral surface of the conductive pattern 130. That is, the magnetic layer 150 is formed not only on the upper surface of the conductive pattern 130 but also in between a conductor and a neighboring conductor in the conductive pattern 130. Accordingly, a gap can be formed in between neighboring conductors of the conductive pattern 130, and the magnetic layer 150 is formed in said gap.

In the case where the magnetic layer 150 includes magnetic powder 151 and resin material 152, the magnetic powder 151 can cover the upper surface and the lateral surface of the conductive pattern 130.

Meanwhile, as the magnetic permeability of the magnetic layer 150 that covers every upper surface and lateral surface of the conductive pattern 130 is increased, the inductance is also increased. Since having the magnetic powder 151 of the magnetic layer 150 present in said gap is advantageous for increasing the inductance, allowing the magnetic powder 151 from the components of the magnetic layer 150 to cover the lateral surface of the conductor in the conductive pattern 130 will further increase the inductance. In such a case, a diameter of the magnetic powder 151 of the magnetic layer 150 can be smaller than a width of said gap.

As described above, the common mode filter in accordance with an embodiment of the present invention forms a single-layer of conductive pattern and thus can reduce a signal leak and improve the inductance according to the structure of the insulator film and the magnetic layer. As a result, the noise-removing function of the common mode filter can be enhanced.

Although a certain embodiment of the present invention has been described, it shall be appreciated that there can be a very large number of permutations and modification of the present invention by those who are ordinarily skilled in the art to which the present invention pertains without departing from the technical ideas and boundaries of the present invention, which shall be defined by the claims appended below.

It shall be also appreciated that many other embodiments other than the embodiment described above are included in the claims of the present invention.

What is claimed is:

1. A common mode filter comprising:
    a magnetic substrate;
    a dielectric layer laminated on the magnetic substrate;
    an external electrode formed on the dielectric layer in such a way that one surface thereof is exposed to an outside;
    conductive patterns formed in a single-layer structure,
        wherein each of the conductive patterns has one end thereof connected with the external electrode, is protruded from one surface of the dielectric layer in such a way that the conductive patterns are located on a same plane as the external electrode, and comprises a plurality of straight-line parts and a plurality of connection parts formed in curved lines and connecting the plurality of straight-line parts with each other;

a magnetic layer, comprising magnetic powder and resin material and formed on the one surface of the dielectric layer and the conductive patterns so as to fill a separate space between the straight-line parts that are adjacent to each other and a separate space between the connection parts that are adjacent to each other; and an insulator film interposed between the conductive patterns and the magnetic layer so as to insulate the conductive patterns from the magnetic layer.

2. The common mode filter of claim 1, wherein the conductive patterns are each in a zigzag shape.

3. The common mode filter of claim 1, wherein the insulator film comprises an oxide film.

4. The common mode filter of claim 1, wherein the insulator film is contiguously formed along the surfaces of the conductive patterns and on the dielectric layer.

5. The common mode filter of claim 1, wherein the magnetic layer and the insulator film directly contact with each other.

* * * * *